(12) United States Patent
Niikura

(10) Patent No.: US 11,368,149 B2
(45) Date of Patent: Jun. 21, 2022

(54) HIGH-SIDE GATE DRIVER

(71) Applicant: ROHM CO., LTD., Kyoto (JP)

(72) Inventor: Hiroki Niikura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 285 days.

(21) Appl. No.: 16/819,713

(22) Filed: Mar. 16, 2020

(65) Prior Publication Data

US 2020/0295745 A1    Sep. 17, 2020

(30) Foreign Application Priority Data

Mar. 15, 2019    (JP) ................ JP2019-048785

(51) Int. Cl.
| | | |
|---|---|---|
| *H03K 17/082* | (2006.01) | |
| *H02P 27/06* | (2006.01) | |
| *H02M 3/335* | (2006.01) | |
| *H02M 1/08* | (2006.01) | |
| *H02M 3/158* | (2006.01) | |

(52) U.S. Cl.
CPC .......... *H03K 17/0822* (2013.01); *H02M 1/08* (2013.01); *H02M 3/158* (2013.01); *H02M 3/33584* (2013.01); *H02P 27/06* (2013.01); *H03K 2217/0063* (2013.01)

(58) Field of Classification Search
CPC ............ H02M 1/00; H02M 1/08; H02M 1/16; H02M 1/32; H02M 3/00; H02M 3/07; H02M 3/073; H02M 3/137; H02M 3/1582; H02M 7/00; H02M 2001/32; H02M 2003/073; H02M 3/33584; H02M 3/158; H02P 7/292; H02P 7/295; H02P 11/00; H02P 11/04; H02P 23/00; H02P 27/00; H02P 27/04; H02P 27/06; H03K 17/0822; H03K 2217/0063
See application file for complete search history.

(56) References Cited

U.S. PATENT DOCUMENTS

2007/0146020 A1*  6/2007  Williams .............. H02M 3/158
                                                    327/110

FOREIGN PATENT DOCUMENTS

JP          2011014738 A       1/2011

* cited by examiner

*Primary Examiner* — Antony M Paul
(74) *Attorney, Agent, or Firm* — Cantor Colburn LLP

(57) ABSTRACT

A selection circuit generates a voltage $V_S$ of a switching terminal VS or a power supply voltage $V_{CC}$, whichever is higher, in a common line. A regulator stabilizes a voltage $V_{COML}$ of a reference line at a level lower than a voltage $V_{COM}$ of the common line by a predetermined voltage difference $\Delta V$. A charge pump circuit is provided between the common line and the reference line and steps up a voltage difference $\Delta V$ between the common line and the reference line. A rectifying element charges a bootstrap capacitor between a bootstrap terminal and the switching terminal, with an output voltage of the charge pump circuit.

12 Claims, 8 Drawing Sheets

COMPARATIVE ART

HIGH-SIDE GATE DRIVER

CROSS REFERENCE TO RELATED APPLICATIONS

The present invention claims priority under 35 U.S.C. § 119 to Japanese Application No. 2019-048785 filed Mar. 15, 2019, the entire content of which is incorporated herein by reference.

BACKGROUND OF THE INVENTION

1. Field of the Invention

The present invention relates to a switching circuit.

2. Description of the Related Art

A switching circuit is used for a DC (direct current)/DC converter, an inverter, or the like. FIG. 1 is a circuit diagram of a switching circuit. A switching circuit 100 includes a high-side transistor $M_1$ provided between an input terminal (VCC) and a switching terminal (LX), a low-side transistor $M_2$ provided between the LX terminal and a ground terminal (GND). When the high-side transistor $M_1$ is ON and the low-side transistor $M_2$ is OFF, the LX terminal is at a high level (a voltage $V_{CC}$ of the VCC terminal is generated). When the high-side transistor $M_1$ is OFF and the low-side transistor $M_2$ is ON, a low-level voltage (a voltage $V_{GND}$ of the GND terminal) is generated at the LX terminal. Additionally, the low-side transistor $M_2$ may be replaced by a rectifying element such as a Schottky diode.

As the high-side transistor $M_1$, an N-channel (or an NPN-type) transistor is used in some cases. In such a case, to turn on the high-side transistor $M_1$, a gate voltage $V_{HG}$ higher than an input voltage $V_{CC}$ needs to be fed to a gate of the transistor. In order to generate the gate voltage $V_{HG}$ higher than the input voltage $V_{CC}$, a bootstrap circuit is employed.

A bootstrap capacitor $C_{BST}$ is coupled between a bootstrap terminal (BST) and the LX terminal. A power supply circuit 110 for the bootstrap circuit generates a constant voltage $V_{HREG}$. The constant voltage $V_{HREG}$ is set to be higher than a gate-source threshold voltage $V_{GS(th)}$ of the high-side transistor M. The constant voltage $V_{HREG}$ is applied to the bootstrap capacitor $C_{BST}$ via a diode $D_1$ and the BST terminal.

When the LX terminal is at a low level (0 V), the bootstrap capacitor $C_{BST}$ is charged with $\Delta V = V_{HREG} - Vf$. Vf represents a forward voltage of the diode D. A voltage $V_{BST}$ of the BST terminal is equal to $V_{LX} + \Delta V$. The voltage $V_{BST}$ of the BST terminal is supplied to an upper power supply terminal of a high-side gate driver 120. A lower power supply terminal of the high-side gate driver 120 is coupled to the LX terminal. The high-side gate driver 120 outputs $V_{BST}$ when a control signal $S_H$ is at a level for ON (a high level, for example) and outputs $V_{LX}$ when the control signal $S_H$ is at a level for OFF (a low level, for example).

In the bootstrap circuit in FIG. 1, the bootstrap capacitor $C_{BST}$ cannot be charged without a switching operation of the high-side transistor M. For this reason, the high-side transistor $M_1$ cannot be kept ON over a plurality of switching cycles. This causes a problem of incapability of operating at a duty ratio of 100%.

SUMMARY OF THE INVENTION

The present invention has been devised in view of the above-described situations, and one of general and illustrative purposes of one embodiment thereof is to provide a high-side gate driver capable of driving a high-side transistor at a duty ratio of 100%.

One embodiment of the present invention relates to a high-side gate driver that drives an N-type high-side transistor. The high-side gate driver includes: a switching terminal coupled to a source of the high-side transistor; a bootstrap terminal; a common line; a reference line; a selection circuit structured to generate a voltage of the switching terminal or a power supply voltage, whichever is higher, in the common line; a regulator structured to stabilize a voltage of the reference line at a level lower than a voltage of the common line by a predetermined voltage difference; a charge pump circuit provided between the common line and the reference line, the charge pump circuit being structured to step up a voltage difference between the common line and the reference line; a rectifying element structured to charge a bootstrap capacitor provided between the bootstrap terminal and the switching terminal, with an output voltage of the charge pump circuit; and a driver having an upper power supply terminal coupled to the bootstrap terminal and a lower power supply terminal coupled to the switching terminal, the driver having an output coupled to a gate of the high-side transistor.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Overview of Embodiments

Figure 1:
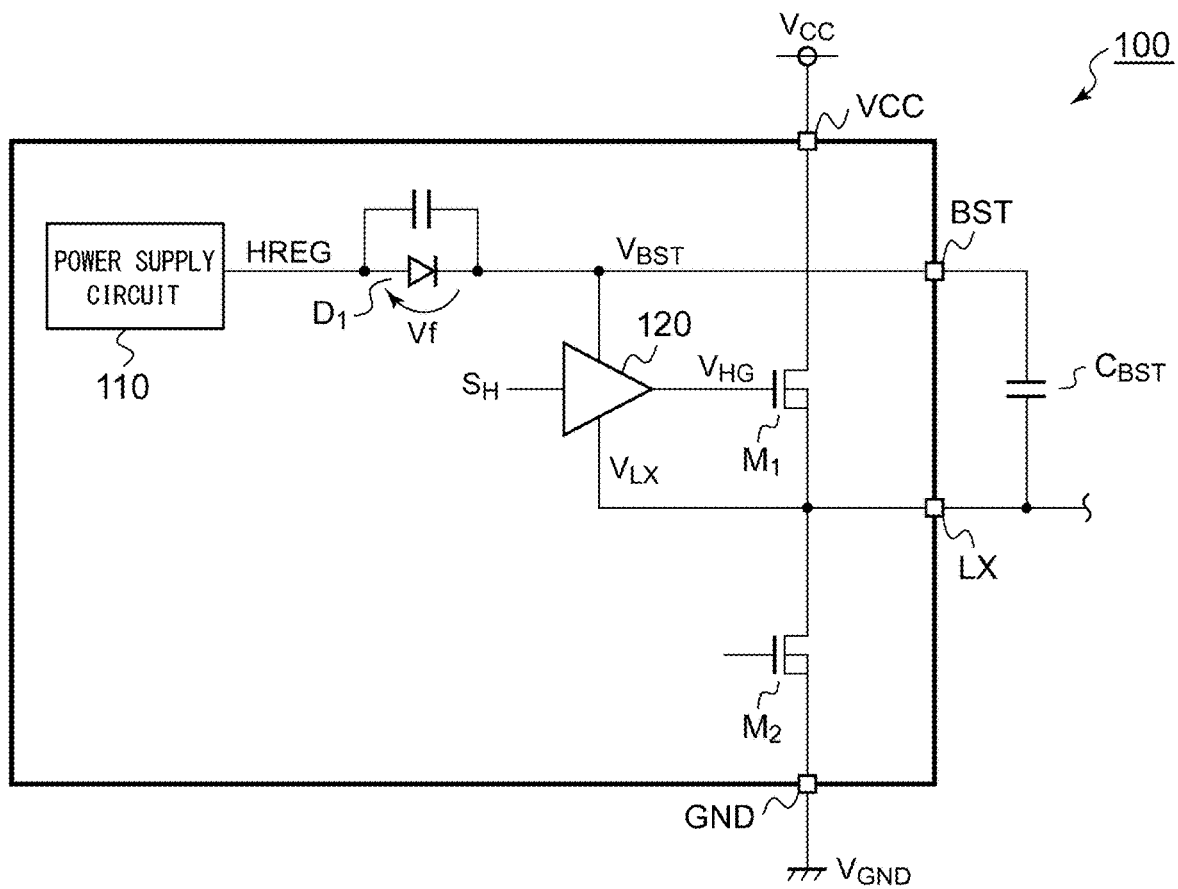
FIG. 1 is a circuit diagram of a switching circuit.

One embodiment disclosed in this specification relates to a high-side gate driver that drives an N-type high-side transistor. N-type transistors include an N-channel metal oxide semiconductor field effect transistor (MOSFET), an N-channel insulated gate bipolar transistor (IGBT), an NPN-type bipolar transistor, and the like. The high-side gate driver includes a switching terminal coupled to a source of the high-side transistor, a bootstrap terminal, a common line, a reference line, a selection circuit that generates a voltage of the switching terminal or a power supply voltage, whichever is higher, in the common line, a regulator that stabilizes a voltage of the reference line at a level lower than a voltage of the common line by a predetermined voltage difference, a charge pump circuit that is provided between the common line and the reference line and steps up a voltage difference between the common line and the reference line, a rectifying element that charges a bootstrap capacitor provided between the bootstrap terminal and the switching terminal, with an output voltage of the charge pump circuit, and a driver that has an upper power supply terminal coupled to the bootstrap terminal and a lower power supply terminal coupled to the switching terminal, and has an output coupled to a gate of the high-side transistor.

A voltage $V_S$ of the switching terminal is equal to an input voltage $V_{IN}$ of a drain (or a collector) of the high-side transistor when the high-side transistor is ON, and the voltage $V_S$ is equal to 0 V or a different voltage when the high-side transistor is OFF. Thus, as a voltage $V_{COM}$ of the common line (referred to as a common voltage), $V_{IN}$ occurs when the high-side transistor is ON and a power supply voltage $V_{CC}$ occurs when the high-side transistor is OFF. A voltage $V_{COML}$ of the reference line (referred to as a reference voltage) is stabilized at $V_{COM}-\Delta V$ by the regulator. $\Delta V$ represents a predetermined voltage difference. In a case where a step-up rate of the charge pump circuit is N-fold, an output voltage $V_{cp}$ of the charge pump circuit is $V_{COML}+N\times\Delta V=V_{COM}-\Delta V+N\times\Delta V=V_{COM}+(N-1)\times\Delta V$. When the high-side transistor is ON, $V_{COM}=V_S=V_{IN}$, so that a voltage $V_B$ of a bootstrap line is $V_B=V_{IN}+(N-1)\times\Delta V$. Thus, a voltage of $(N-1)\times\Delta V$ is applied across a gate and a source (a base and an emitter) of the high-side transistor, which allows the high-side transistor to be kept ON. On the other hand, when the high-side transistor is OFF, $V_{COM}=V_{CC}$, so that the voltage $V_B$ of the bootstrap line is $V_B=V_{CC}+(N-1)\times\Delta V$. In this case, to turn on the high-side transistor, a voltage of $V_{CC}+(N-1)\times\Delta V$ is applied across the gate and the source (the base and the emitter). Thus, the high-side transistor can be turned on.

The high-side gate driver may further include an overvoltage protection circuit that compares a voltage difference between the bootstrap terminal and the switching terminal with a predetermined threshold value and extracts an electric current from the bootstrap terminal when the voltage difference is higher than the threshold value. This can prevent a high voltage exceeding a withstand voltage from being applied to a transistor forming the driver, and prevent a high voltage exceeding a withstand voltage from being applied across a gate and a source (a base and an emitter) of the high-side transistor.

The overvoltage protection circuit may supply a current extracted from the bootstrap terminal to the common line. That is, an extracted current can be reused, which enables highly efficient operations.

The charge pump circuit may include an oscillator provided between the common line and the reference line, and may operate in accordance with a clock generated by the oscillator. The high-side gate driver may further include an overvoltage protection circuit that compares a voltage difference between the bootstrap terminal and the switching terminal with a predetermined threshold value and stops the oscillator when the voltage difference is higher than the threshold value. This can stop a charge pump operation.

The charge pump circuit may include an oscillator that uses a ground line as a reference and a level shifter that performs level-shifting on a clock generated by the oscillator. The charge pump circuit may operate in accordance with a clock that has been subjected to level-shifting by the level shifter.

The regulator may include an electric-current source provided between the reference line and ground and a feedback circuit that controls the electric-current source so that a voltage difference between the voltage of the common line and the voltage of the reference line gets close to the predetermined voltage difference.

The high-side gate driver may be integrated into one semiconductor substrate. The terms "be integrated" cover a case where all composing elements of a circuit are formed on a semiconductor substrate and a case where main composing elements of a circuit are integrated, and a part of resistors or capacitors may be provided outside a semiconductor substrate to adjust circuit constants. Integration of a circuit on a single chip can reduce a circuit area and maintain uniform characteristics of circuit elements.

Embodiments

The invention will now be described based on preferred embodiments which do not intend to limit the scope of the present invention but exemplify the invention. All of the features and the combinations thereof described in the embodiment are not necessarily essential to the invention.

In this specification, the terms "a state where a member A is coupled to a member B" cover not only a case where the member A and the member B are physically coupled directly to each other, but also a case where the member A and the member B are coupled indirectly to each other via other members that do not substantially affect their electrical coupling or do not impair functions or effects provided by combination of the members.

Likewise, the terms "a state where a member C is provided between a member A and a member B" cover not only a case where the member A and the member C, or the member B and the member C, are coupled directly to each other, but also a case where the member A and the member C, or the member B and the member C, are coupled indirectly to each other via other members that do not substantially affect their electrical coupling or do not impair functions or effects provided by combination of the members.

Further, the terms "a signal A (voltage, current) in accordance with a signal B (voltage, current)" mean that the signal A is correlated with the signal B, and more specifically, cover a case (i) where the signal A is the signal B, a case (ii) where the signal A is proportional to the signal B, a case (iii) where the signal A is obtained by level-shifting of the signal B, a case (iv) where the signal A is obtained by amplification of the signal B, a case (v) where the signal A is obtained by inversion of the signal B, a case (vi) where the above cases are randomly combined, and the like. Those skilled in the art would comprehend that the scope covered by the terms "in accordance with" depends on the kinds or applications of the signals A and B.

Figure 2:
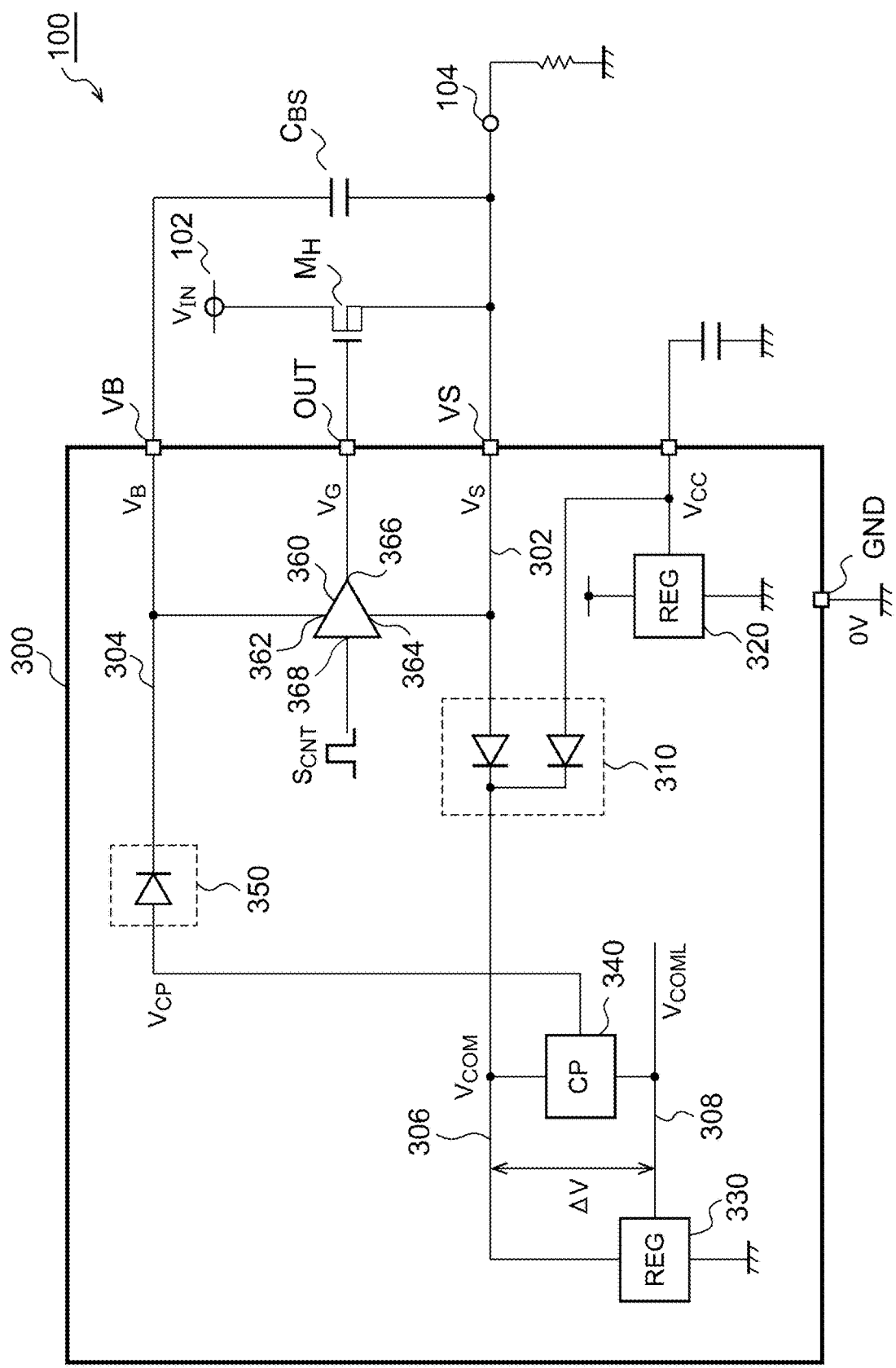
FIG. 2 is a circuit diagram of a switching circuit including a high-side gate driver according to an embodiment.

FIG. 2 is a circuit diagram of a switching circuit 100 including a high-side gate driver 300 according to the embodiment. The switching circuit 100 includes a high-side transistor $M_H$, the high-side gate driver 300 that drives the high-side transistor $M_H$, and a bootstrap capacitor $C_{BS}$.

The high-side transistor $M_H$ is an N-type transistor and has a drain coupled to an input terminal 102 and a source coupled to an output terminal 104. A direct-current input voltage $V_{IN}$ is supplied to the input terminal 102. The input voltage $V_{IN}$ is a high voltage of several tens of volts or higher, and for example, the input voltage $V_{IN}$ is 48 V.

The high-side gate driver 300 includes a switching terminal VS, an output terminal OUT, a bootstrap terminal VB, a ground terminal GND, and a power supply terminal VCC. The output terminal OUT is coupled to a gate of the high-side transistor $M_H$ and the switching terminal VS is coupled to a source of the high-side transistor $M_H$. A bootstrap capacitor $C_{BS}$ is externally attached between the bootstrap terminal VB and the switching terminal VS. The ground terminal GND is grounded.

The high-side gate driver 300 includes a switching line 302, a bootstrap line 304, a common line 306, a reference line 308, a selection circuit 310, a power supply circuit 320, a regulator 330, a charge pump circuit 340, a rectifying element 350, and a driver 360, which are integrated into one semiconductor substrate.

The switching line 302 is coupled to the switching terminal VS, and the bootstrap line 304 is coupled to the bootstrap terminal VB. A voltage of the switching line 302 is referred to as a switching voltage $V_S$, and a voltage of the bootstrap line 304 is referred to as a bootstrap voltage $V_B$. The switching voltage $V_S$ is equal to $V_{IN}$ when the high-side transistor $M_H$ is ON, and the switching voltage $V_S$ is equal to 0 V (or a different voltage in accordance with a state of a load) when the high-side transistor $M_H$ is OFF.

The power supply circuit 320 generates a power supply voltage $V_{CC}$. The power supply circuit 320 may be provided outside the high-side gate driver 300 so that the power supply terminal VCC of the high-side gate driver 300 may receive the power supply voltage $V_{CC}$.

The selection circuit 310 generates the voltage $V_S$ of the switching terminal VS or the power supply voltage $V_{CC}$, whichever is higher, in the common line 306. The selection circuit 310 can be formed of a diode OR circuit, for example. However, the configuration of the selection circuit 310 is not limited to that.

The regulator 330 stabilizes a voltage $V_{COML}$ of the reference line 308 at a level ($V_{COM}-\Delta V$) lower than that of a common voltage $V_{COM}$ of the common line 306 by a predetermined voltage difference $\Delta V$.

The charge pump circuit 340 is provided between the common line 306 and the reference line 308, and steps up a voltage difference between the common line 306 and the reference line 308. In other words, the charge pump circuit 340 operates using the reference line 308 as a virtual ground voltage. In a case where a step-up rate of the charge pump circuit 340 is N, an output voltage of the circuit (charge pump voltage $V_{CP}$) is $V_{CP}=V_{COML}+\Delta V \times N$. Substituting $V_{COM}-\Delta V$ into $V_{COML}$ yields $V_{CP}=V_{COM}-\Delta V+\Delta V \times N=V_{COM}+(N-1)\times\Delta V$.

The rectifying element 350 charges the bootstrap capacitor $C_{BS}$ provided between the bootstrap terminal VB and the switching terminal VS, with the output voltage $V_{CP}$ of the charge pump circuit 340. If voltage drop across the rectifying element 350 is neglected, $V_B=V_{CP}$. The rectifying element 350 may be formed of a switch (transistor).

The driver 360 has an upper power supply terminal 362 coupled to the bootstrap terminal VB and a lower power supply terminal 364 coupled to the switching terminal VS, and has an output 366 coupled to a gate of the high-side transistor $M_H$ via the output terminal OUT. A control signal is input to an input terminal 368 of the driver 360 via a level shifter not shown. The driver 360 outputs a high-level voltage $V_B$ when a control signal $S_{CNT}$ is at a level for ON (high level, for example) and outputs a low-level voltage $V_S$ when the control signal $S_{CNT}$ is at a level for OFF (low level, for example).

Figure 3:
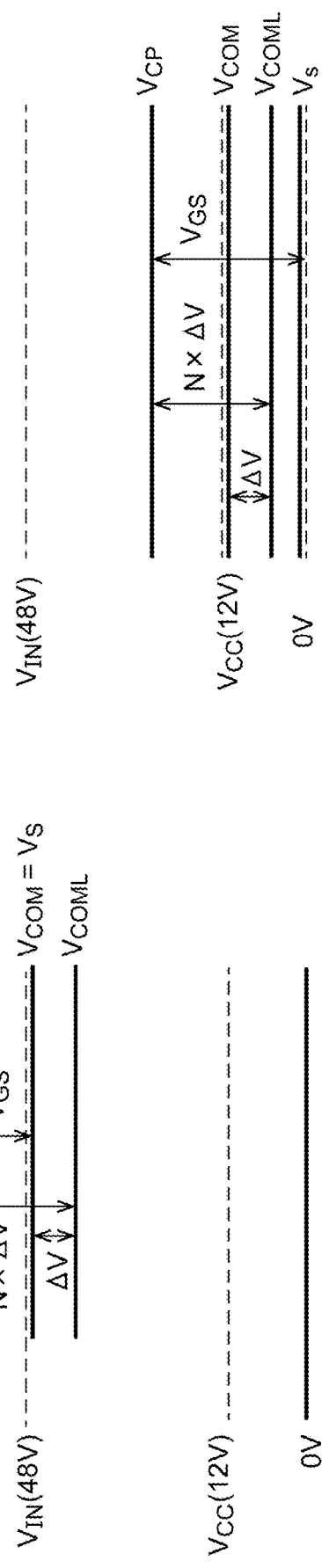
FIGS. 3A and 3B are level diagrams for explaining operations of the switching circuit in FIG. 2.

Hereinabove, the configuration of the high-side gate driver 300 has been described. Next, operations of the high-side gate driver 300 will be described. FIGS. 3A and 3B are level diagrams for explaining operations of the switching circuit 100 in FIG. 2. FIG. 3A shows voltage levels of various nodes, observed when the high-side transistor $M_H$ is ON. FIG. 3B shows voltage levels of various nodes, observed when the high-side transistor $M_H$ is OFF. For easier understanding, it is assumed that $V_{IN}=48$ V and $V_{CC}=12$ V. Further, it is assumed that $\Delta V=5$ V. Moreover, it is assumed that a step-up rate N of the charge pump circuit 340 is triple.

FIG. 3A is referred to. When the high-side transistor $M_H$ is ON, $V_S=V_{IN}=48$ V. As a relation of $V_S>V_{CC}$ is established, $V_{COM}=V_S=48$ V. Further, the regulator 330 stabilizes the reference voltage $V_{COML}$ of the reference line 308 at $V_{COML}=V_{COM}-\Delta V=V_S-\Delta V=43$ V. The charge pump voltage $V_{CP}$ and the bootstrap voltage $V_B$ are $V_{GP}=V_B=V_{COML}+N\times\Delta V=V_S+(N-1)\times\Delta V=53$ V. As a gate voltage $V_G$ of the high-side transistor $M_H$ is equal to the bootstrap voltage $V_B$, a gate-source voltage $V_{GS}$ is $V_G-V_S=V_B-V_S=(N-1)\times\Delta V=10$ V.

FIG. 3B is referred to. When the high-side transistor $M_H$ is OFF, $V_S=0$ V. As a relation of $V_S<V_{CC}$ is established, $V_{COM}=V_{CC}=12$ V. Further, the regulator 330 stabilizes the reference voltage $V_{COML}$ of the reference line 308 at $V_{COML}=V_{COM}-\Delta V=V_{CC}-\Delta V=7$ V. The charge pump voltage $V_{CP}$ and the bootstrap voltage $V_B$ are $V_{CP}=V_B=V_{COML}+N\times\Delta V=V_{CC}+(N-1)\times\Delta V=22$ V. The gate-source voltage $V_{GS}$ of the high-side transistor $M_H$ is $V_B-V_S=22$ V.

The high-side gate driver 300 can keep the high-side transistor $M_H$ ON, thereby achieving a duty ratio of 100%.

Advantages of the high-side gate driver 300 will be clarified by comparison with a comparative art described below.

Comparative Art

Figure 4:
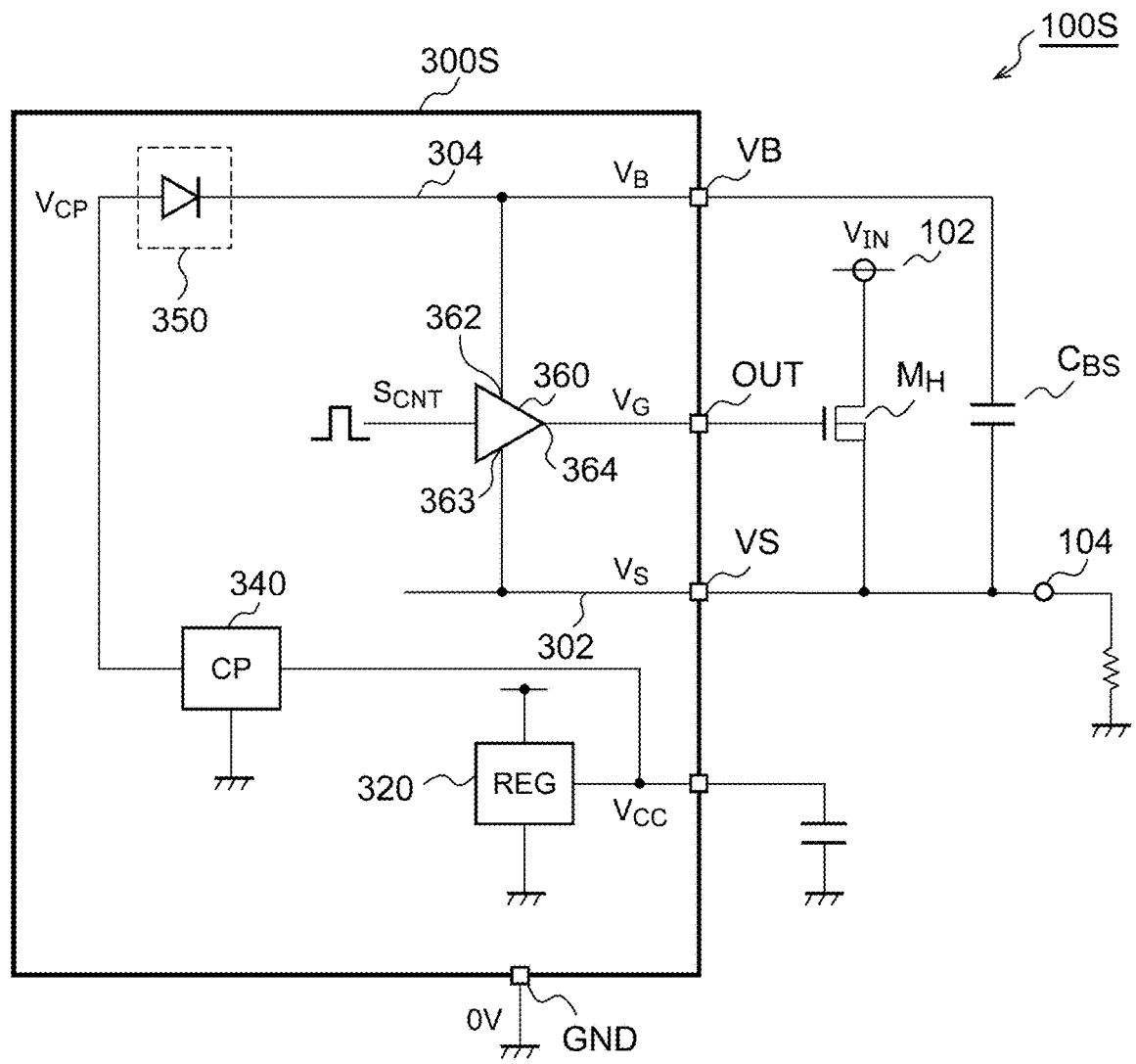
FIG. 4 is a circuit diagram of a high-side gate driver according to a comparative art.

FIG. 4 is a circuit diagram of a high-side gate driver 300S according to a comparative art. In the comparative art, the charge pump circuit 340 operates using a ground voltage as a reference, and an input voltage of the charge pump circuit 340 is the power supply voltage $V_{CC}$.

In order to keep the high-side transistor $M_H$ ON, a relation of $V_B>V_S+V_{GS(th)}$ needs to be established. $V_{GS(th)}$ represents a threshold voltage across a gate and a source of the high-side transistor $M_H$, and is set to 5 V, for example. Then, a relation of $V_B>48$ V+5 V=53 V is established, and thus a step-up rate of the charge pump circuit 340 is required to be greater than quadruple. A circuit area of a charge pump circuit typically becomes smaller as a step-up rate thereof is lower. Thus, the high-side gate driver 300 according to the embodiment, which allows a lower step-up rate of a charge pump circuit than that of the comparative art, produces advantages of a smaller circuit area.

Meanwhile, consider a state in which the high-side transistor $M_H$ is OFF. In the comparative art, a constant bootstrap voltage $V_B$ (>53 V) is generated in the bootstrap line 304 at all times, regardless of whether the high-side transistor $M_H$ is ON or OFF. If the driver 360 applies a high voltage of 53 V to a gate of the high-side transistor $M_H$ being OFF, the applied voltage exceeds a gate withstand voltage of the high-side transistor $M_H$. For this reason, there is a need for clamping to make a voltage difference between the bootstrap line 304 and the switching line 302 smaller than a withstand voltage of the transistor so that a gate-source voltage does not exceed a withstand voltage. Assuming that a withstand voltage of a transistor is 25 V, such a great voltage difference as 53 V−25 V=28 V needs to be absorbed by a clamping circuit, which leads to wasteful power consumption. In contrast thereto, with the high-side gate driver 300 according to the embodiment, a gate-source voltage of the high-side transistor $M_H$ being OFF is approximately 22 V, which enables operations at significantly high efficiency.

Also in the high-side gate driver 300 in FIG. 2, an overvoltage may possibly be applied across a gate and a source of the high-side transistor $M_H$ when the high-side transistor $M_H$ changes from an ON state to an OFF state. A technique for avoiding such situation will be described.

Figure 5:
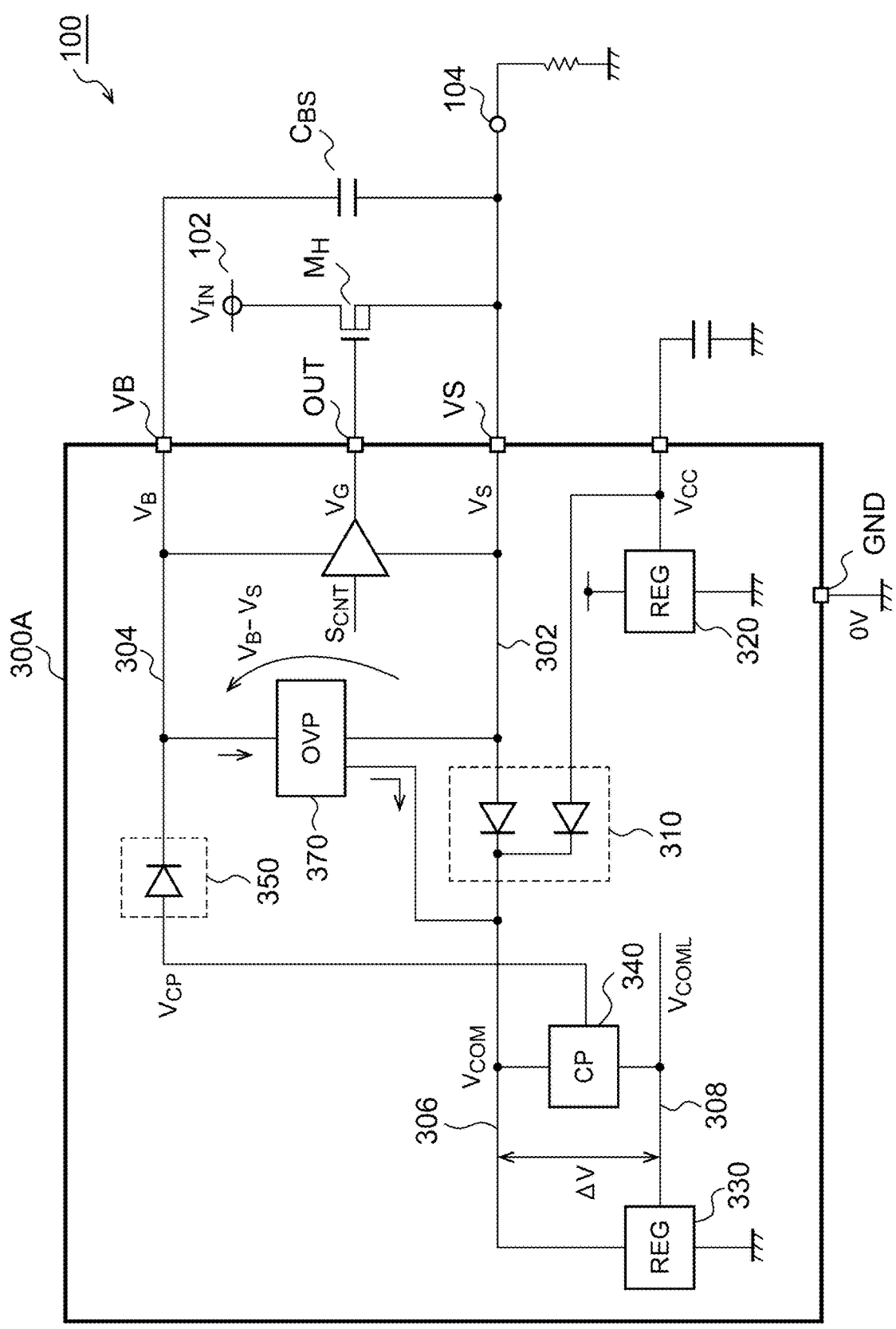
FIG. 5 is a circuit diagram of a high-side gate driver according to a modification.

FIG. 5 is a circuit diagram of a high-side gate driver 300A according to a modification. The high-side gate driver 300A includes an overvoltage protection (OVP) circuit 370, in addition to the high-side gate driver 300 in FIG. 2. The OVP circuit 370 compares a voltage difference $V_B-V_S$ between the bootstrap terminal VB and the switching terminal VS with a predetermined threshold value $V_{OVP}$, and extracts a current from the bootstrap terminal VB when the voltage difference $V_B-V_S$ is higher than the threshold value $V_{OVP}$. The threshold value $V_{OVP}$ can be determined in consideration of a withstand voltage of the high-side transistor $M_H$ or the driver 360. This can prevent a high voltage exceeding a withstand voltage from being applied to a transistor forming the driver 360, or prevent a high voltage exceeding a withstand voltage from being applied across a gate and a source (a base and an emitter) of the high-side transistor $M_H$.

Preferably, the OVP circuit 370 supplies the current extracted from the bootstrap terminal VB to the common line 306. This allows reuse of an extracted current, thereby enabling highly efficient operations.

Below, a more specific configuration example of the high-side gate driver 300A will be described.

Figure 6:
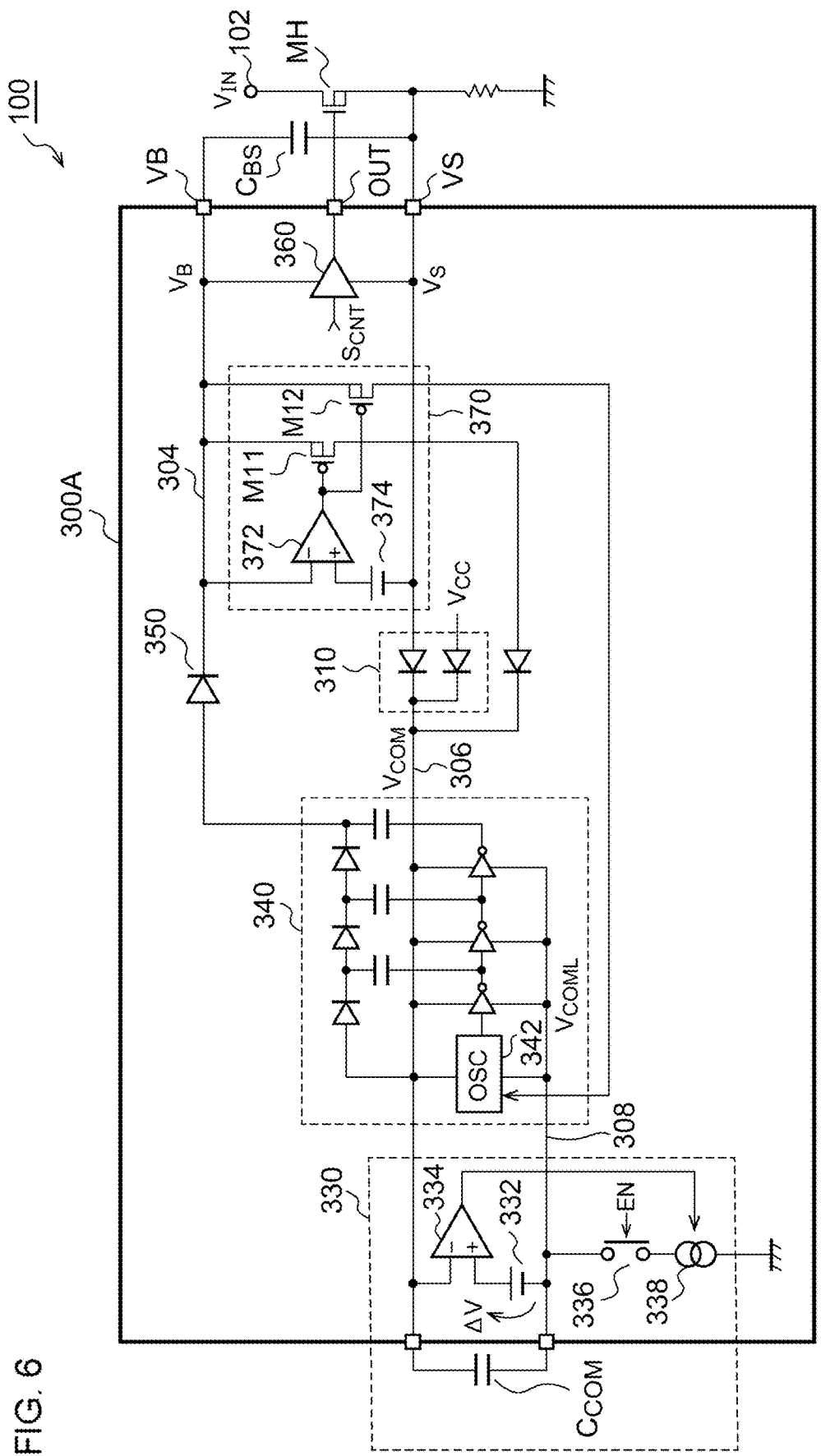
FIG. 6 is a circuit diagram showing a first configuration example of the high-side gate driver.

FIG. 6 is a circuit diagram showing a first configuration example of the high-side gate driver 300A. The charge pump circuit 340 includes an oscillator 342 provided between the common line 306 and the reference line 308. This eliminates a need for transfer of a clock signal from the oscillator that operates using a ground voltage as a reference to the charge pump circuit 340 via the level shifter, thereby simplifying the circuit configuration.

The configuration and topology of the charge pump circuit 340 are not limited to a particular configuration and particular topology, and various known circuits can be employed. A step-up rate of the charge pump circuit 340 in FIG. 6 is triple.

The OVP circuit 370 compares a voltage difference $V_B-V_S$ between the bootstrap terminal VB and the switching terminal VS with the predetermined threshold value $V_{OVP}$. Then, in a case of an overvoltage state where the voltage difference $V_B-V_S$ is higher than the threshold value $V_{OVP}$, the OVP circuit 370 extracts a current from the bootstrap line 304 and supplies the extracted current to the common line 306. Further, in the case of such an overvoltage state, the OVP circuit 370 stops the oscillator 342. This stops a step-up operation of the charge pump circuit 340, thereby reducing wasteful power consumption.

The OVP circuit 370 includes a comparator 372, a voltage source 374, and transistors M11 and M12. The voltage source 374 generates the threshold value $V_{OVP}$. The comparator 372 compares $V_B$ and $V_S+V_{OVP}$, and outputs LOW when $V_B>V_S+V_{OVP}$, in other words, in a case of an overvoltage state. Thus, the transistor M11 is turned on, so that electric charge of the bootstrap line 304 is extracted.

Meanwhile, the transistor M12 is provided to notify the oscillator 342 of an overvoltage state. Operations of the oscillator 342 are controlled in association with ON and OFF of the transistor M12.

The regulator 330 includes a voltage source 332, a feedback circuit 334, a switch 336, an electric-current source 338, and an externally-attached capacitor $C_{COM}$. The switch 336 and the current source 338 are provided in series between the reference line 308 and ground. The switch 336 is controlled in accordance with an enable signal EN.

The feedback circuit 334 controls the electric-current source 338 so that a voltage difference between the voltage $V_{COM}$ of the common line 306 and the voltage $V_{COML}$ of the reference line 308 gets close to the predetermined voltage difference ΔV. The feedback circuit 334 may be an error amplifier or a comparator.

Figure 7:
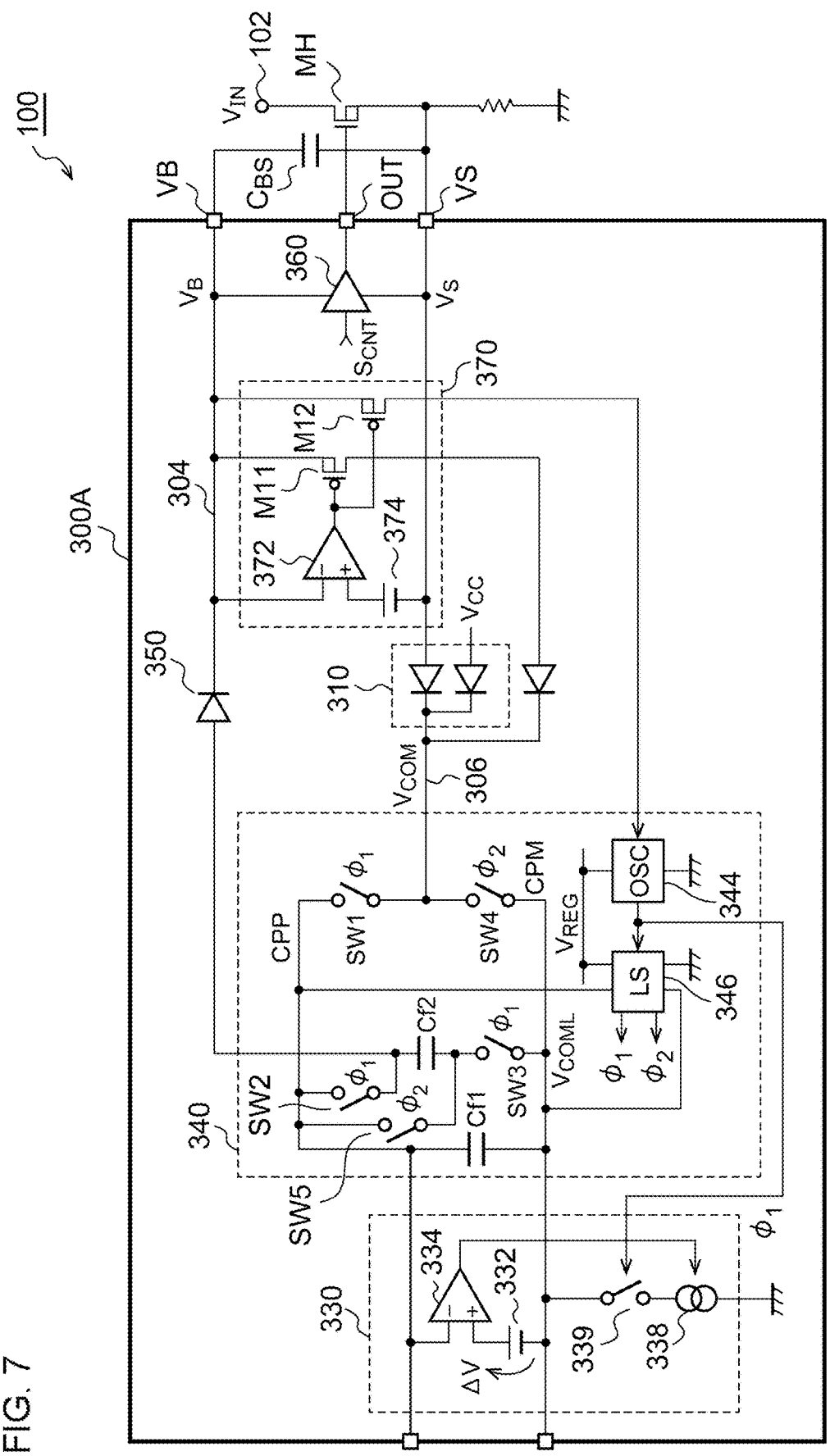
FIG. 7 is a circuit diagram showing a second configuration example of the high-side gate driver.

FIG. 7 is a circuit diagram showing a second configuration example of the high-side gate driver 300A. FIG. 7 is different from FIG. 6 in the configuration of the charge pump circuit 340.

The charge pump circuit 340 includes an oscillator 344 that operates using a ground line as a reference and a level shifter 346. The charge pump circuit 340 is a double step-up circuit including two flying capacitors Cf1 and Cf2. The level shifter 346 generates two-phase clocks ϕ1 and ϕ2 in synchronization with a clock of the oscillator 344. A plurality of switches SW1, SW2, and SW3 of the charge pump circuit 340 perform switching in synchronization with the clock ϕ1 and switches SW4 and SW5 perform switching in synchronization with the clock ϕ2.

The regulator 330 includes a switch 339 in place of the switch 336 in FIG. 6. ON and OFF of the switch 339 are controlled in synchronization with a clock of the oscillator 344. The switch 339 is turned on when being in phase with the switches SW1, SW2, and SW3 to which the clock ϕ1 is supplied.

When the switch 339 is turned off at the same time when the switches SW4 and SW5 that are controlled by the clock ϕ2 are turned on, the common voltage $V_{COM}$ occurs in a CPM node and a voltage $ΔV_1$ across both ends of the flying capacitor Cf1 is added to the common voltage $V_{COM}$. Then, $V_{COM}+ΔV_1$ is generated in a CPP node (first-stage step-up). To this voltage of the CPP node, a voltage $ΔV_2$ across both ends of the flying capacitor Cf2 is further added, so that an output voltage of the charge pump circuit 340 (an anode voltage of the rectifying element 350) becomes equal to $V_{COM}+ΔV_1+ΔV_2$ (second-stage step-up). As each of $ΔV_1$ and $ΔV_2$ is equal to ΔV, an output voltage of the charge pump circuit 340 is $V_{COM}+2×ΔV$.

Applications

Figure 8A:
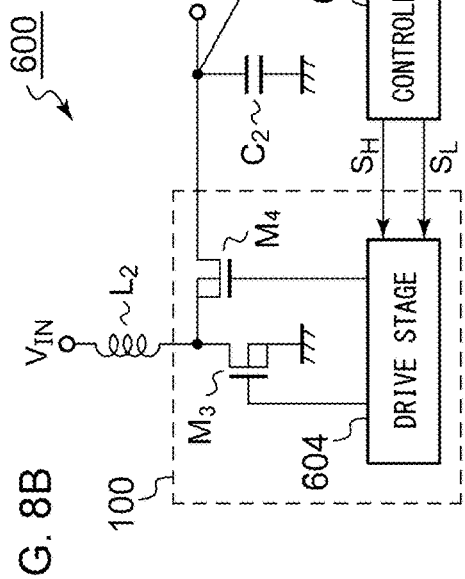
FIGS. 8A to 8D are diagrams showing applications of the switching circuit.

Next, applications of the switching circuit 100 will be described. FIGS. 8A to 8D are diagrams showing applications of the switching circuit 100. FIG. 8A shows a step-down DC/DC converter 500 that includes transistors $M_1$ and $M_2$, an inductor $L_1$, a capacitor $C_{o1}$, a controller 502, and a drive stage 504. The controller 502 generates a high-side pulse $S_H$ and a low-side pulse $S_L$ by feedback control so that a state of a load (an output voltage $V_{OUT}$ or an output current $I_{OUT}$, for example) gets close to its desired value. The transistor $M_1$ corresponds to a high-side transistor, and the drive stage 504 is formed based on architecture of the above-described high-side gate driver 300.

Figure 8B:
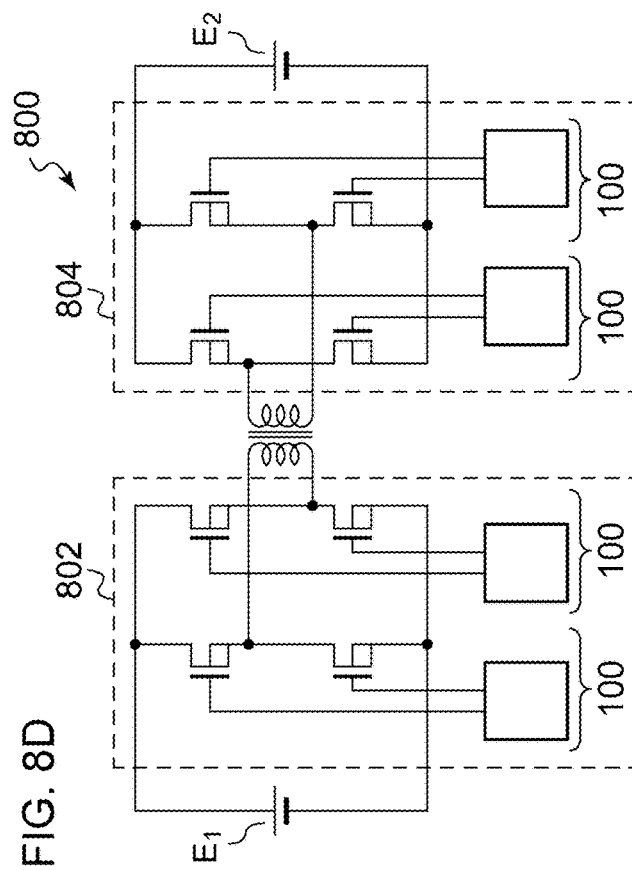

FIG. 8B shows a step-up DC/DC converter 600 that includes transistors $M_3$ and $M_4$, an inductor $L_2$, a capacitor $C_{O2}$, a controller 602, and a drive stage 604. The controller 602 generates a high-side pulse $S_H$ and a low-side pulse $S_L$ by feedback control so that a state of a load (an output voltage $V_{OUT}$ or an output current $I_{OUT}$, for example) gets close to its desired value. The transistor $M_4$ corresponds to a high-side transistor, and the drive stage 604 is formed based on architecture of the above-described high-side gate driver 300. The switching circuit 100 can be used also for a step-up/down converter.

Figure 8C:
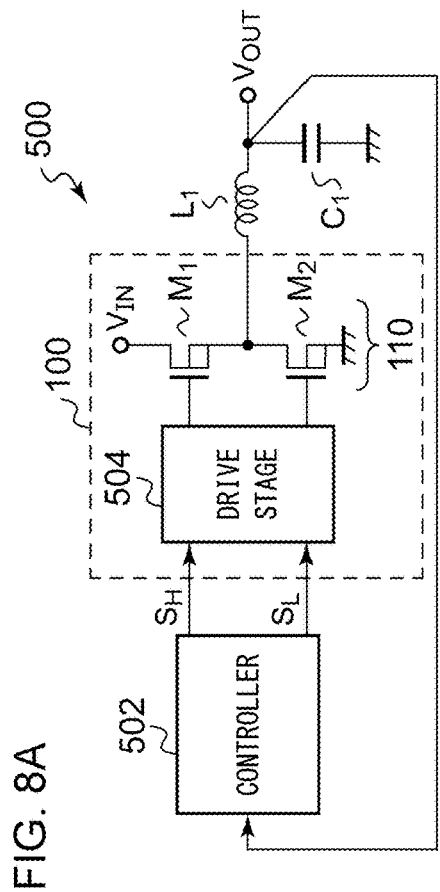

FIG. 8C shows a three-phase motor driver 700 in which each of legs in a U phase, a V phase, and a W phase is formed of the switching circuit 100.

Figure 8D:
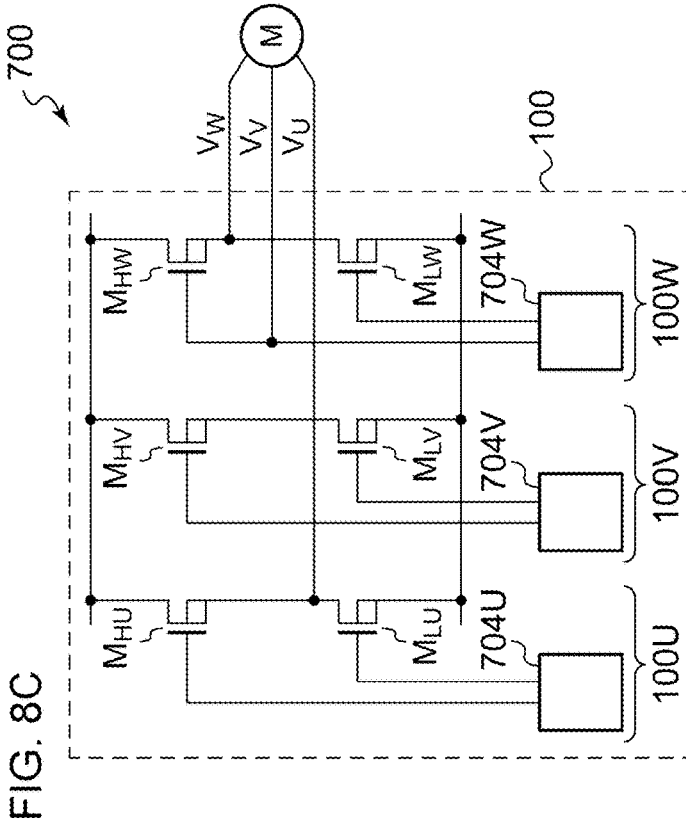

FIG. 8D shows a bidirectional insulating DC/DC converter 800 in which each of legs of a primary H bridge circuit 802 and a secondary H bridge circuit 804 is formed using the switching circuit 100.

While the present invention has been described using specific words and phrases with reference to the embodiments, the embodiments merely describe the principles and applications of the present invention. In the embodiments, various modifications and positional alterations are acceptable within a range not departing from the idea of the present invention recited in claims.

The present specification discloses the following technical idea. That is, a high-side gate driver drives an N-type high-side transistor. The high-side gate driver includes: a switching terminal coupled to a source of the high-side transistor; a driver having an output coupled to a gate of the high-side transistor; a common line; a reference line; a selection circuit structured to generate a voltage of the switching terminal or a power supply voltage, whichever is higher, in the common line; a regulator structured to stabilize a voltage of the reference line at a level lower than a voltage of the common line by a predetermined voltage difference; and a circuit block provided between the common line and the reference line.

Though a charge pump has been described as an example of a circuit block in the embodiments, the function of the circuit block is not limited to that and the circuit block can have other functions. For example, the circuit block may be an abnormality detection circuit such as an overvoltage detection circuit, an overcurrent detection circuit, or an undervoltage lock-out (UVLO), or a current detection circuit.

While the preferred embodiments of the present invention have been described using specific terms, such description is for illustrative purpose only, and it is to be understood that changes and variations may be made without departing from the spirit or scope of the appended claims.

What is claimed is:

1. A high-side gate driver that drives an N-type high-side transistor, comprising:
    a switching terminal to be coupled to a source of the high-side transistor;
    a bootstrap terminal;
    a common line;
    a reference line;
    a selection circuit structured to generate a voltage of the switching terminal or a power supply voltage, whichever is higher, in the common line;
    a regulator structured to stabilize a voltage of the reference line at a level lower than a voltage of the common line by a predetermined voltage difference;
    a charge pump circuit provided between the common line and the reference line, the charge pump circuit being structured to step up a voltage difference between the common line and the reference line;
    a rectifying element structured to charge a bootstrap capacitor provided between the bootstrap terminal and the switching terminal, with an output voltage of the charge pump circuit; and
    a driver having an upper power supply terminal coupled to the bootstrap terminal and a lower power supply terminal coupled to the switching terminal, the driver having an output coupled to a gate of the high-side transistor.

2. The high-side gate driver according to claim 1, further comprising
    an overvoltage protection circuit structured to compare a voltage difference between the bootstrap terminal and the switching terminal with a predetermined threshold value, and extract an electric current from the bootstrap terminal when the voltage difference is higher than the threshold value.

3. The high-side gate driver according to claim 2, wherein the overvoltage protection circuit is structured to supply the electric current extracted from the bootstrap terminal to the common line.

4. The high-side gate driver according to claim 1, wherein the charge pump circuit includes an oscillator provided between the common line and the reference line, and the oscillator is structured to operate in accordance with a clock generated by the oscillator.

5. The high-side gate driver according to claim 4, further comprising
    an overvoltage protection circuit structured to compare a voltage difference between the bootstrap terminal and the switching terminal with a predetermined threshold value, and to stop the oscillator when the voltage difference is higher than the threshold value.

6. The high-side gate driver according to claim 5, wherein the overvoltage protection circuit is structured to extract an electric current from the bootstrap terminal when the voltage difference is higher than the threshold value.

7. The high-side gate driver according to claim 6, wherein the overvoltage protection circuit is structured to supply the electric current extracted from the bootstrap terminal to the common line.

8. The high-side gate driver according to claim 1, wherein the charge pump circuit includes:
    an oscillator structured to use a ground line as a reference; and
    a level shifter structured to level-shift a clock generated by the oscillator, and
    the charge pump circuit operates in accordance with a clock which is level-shifted by the level shifter.

9. The high-side gate driver according to claim 1, wherein the regulator includes:
    an electric-current source provided between the reference line and ground; and
    a feedback circuit structured to control the electric-current source so that a voltage difference between the voltage of the common line and the voltage of the reference line gets close to the predetermined voltage difference.

10. The high-side gate driver according to claim 1, wherein the high-side gate driver is integrated into one semiconductor substrate.

11. A switching circuit comprising:
    a high-side transistor; and
    the high-side gate driver according to claim 1, the high-side gate driver being structured to drive the high-side transistor.

12. A motor driver comprising the high-side gate driver as recited in claim 1.

\* \* \* \* \*